United States Patent [19]
Papen et al.

[11] Patent Number: 5,379,310
[45] Date of Patent: Jan. 3, 1995

[54] EXTERNAL CAVITY, MULTIPLE WAVELENGTH LASER TRANSMITTER

[75] Inventors: George C. Papen, Urbana; G. Matthew Murphy; David Brady, both of Champaign, all of Ill.

[73] Assignee: Board of Trustees of the University of Illinois, Champaign, Ill.

[21] Appl. No.: 58,565

[22] Filed: May 6, 1993

[51] Int. Cl.$^6$ .............................................. H01S 3/10
[52] U.S. Cl. ...................... 372/23; 372/20; 372/92; 372/102
[58] Field of Search ............ 372/23, 20, 26, 92, 372/99, 102

[56] References Cited

U.S. PATENT DOCUMENTS

| | | | |
|---|---|---|---|
| 4,696,012 | 9/1987 | Harshaw | 382/102 |
| 5,115,444 | 5/1992 | Kirkby et al. | 372/50 |
| 5,228,103 | 7/1993 | Chen et al. | 372/102 X |
| 5,255,273 | 10/1993 | Nilsson et al. | 372/20 |
| 5,274,657 | 12/1993 | Hori et al. | 372/50 |

OTHER PUBLICATIONS

Soole et al., *Multistripe Array Grating Integrated Cavity (Magic) Laser: A New Semiconductor Laser for WDM Applications,* Appl. Phys. Lett. 61(23), 2750–2752, 7 Dec. 1992.

Nyairo, et al. *Multiple Grating Cavity (MGC) Laser Transmitter for Wavelength Division Multiplexing Application,* IEEE Proceedings J, vol. 138, No. 5: 337–342 Oct. 1991.

Carvalho et al, *Tuneable Multiwavelength Semiconductor Laser with Single Fibre Output,* Electronics Letters, vol. 27, No. 17: 1498–1499 (1991), (no month).

*Primary Examiner*—James W. Davie
*Attorney, Agent, or Firm*—Dressler, Goldsmith, Shore & Milnamow, Ltd.

[57] ABSTRACT

A multiple channel transmitter usable for wavelength division multiplying includes a grating and a curved reflector. A diode array generates a plurality of parallel, spaced apart radiant energy beams which are incident on the grating at an acute angle. The plurality of beams is deflected in part, into the reflector. Back reflected radiant energy is deflected, in part, to the members of tile array causing them to lase at a plurality of different frequencies. The zeroth order deflection of the forward propagating beams off of the grating forms a parallel output.

26 Claims, 4 Drawing Sheets

EXTERNAL CAVITY, MULTIPLE WAVELENGTH LASER TRANSMITTER

This invention was made with Government support under ECD-8943166 awarded by the National Science Foundation. The Government has certain rights in this invention.

FIELD OF THE INVENTION

The invention pertains to multiple wavelength laser light sources and related communications systems. More particularly, the invention pertains to multiple wavelength optical transmitters that are easily tunable and which are usable in wavelength division multiplexing systems.

BACKGROUND OF THE INVENTION

The widespread installation and availability of broad band fiber optic transmission cables has made it possible to substantially increase transmission rates as well as the number of communications which may be transmitted simultaneously through a medium. As a result, there has been substantial interest in wavelength division multiplexing systems and techniques.

Wavelength switchable or multi-channel laser transmitters which can be used for wavelength division multiplexing are known. One such transmitter has been disclosed in an article entitled "Multi-channel Grating Cavity (MGC) Laser Transmitter for Wavelength Division Multiplexing Applications," Nyairo et al., IEE Proceedings, pg. 337, 138 No. 5 (1991).

Another transmitter which utilizes integrated semiconductor Laser array is disclosed in Soole et al., "Multiple Array Grating Integrated Cavity (MAGIC) Laser—A New Semi-conductor Laser for WDM Applications".

Known transmitters using integrated external cavity arrays however usually share a common gain region. As a result of the common gain element or region, optical intermodulation or cross-talk between wavelengths simultaneously present in the transmitter become a significant design issue.

There continues to be a need for laser driven optical transmitters which provide for simultaneous operation of several elements of a laser diode array such that optical cross-talk or intermodulation effects are reduced to a minimum. Further, it would be desirable to be able to fabricate such transmitter units without substantially increasing manufacturing costs.

Additionally, known transmitters tend to be relatively inefficient with respect to the input power levels required to achieve satisfactory output power levels. It would be desirable to be able to increase available output power while at the same time decreasing required input power levels.

Further, transmitters used in wavelength division multiplexing schemes are required to faithfully reproduce the design wavelengths with a high degree of accuracy. It would therefore be desirable that any such transmitter be inherently highly reliable, from the point of view of wavelength stability, among the available wavelengths, as well as exhibit pure spectral density in the design wavelengths.

It is also desirable that tuning of the transmitter be as simple as possible.

SUMMARY OF THE INVENTION

A multiple wavelength, laser driven transmitter in accordance with the present invention includes a dispersive element, such as a diffraction grating, in combination with an element which destroys the shift invariance of the system. A curved reflector can be used to destroy the shift invariance of the system. Alternately, the dispersive element could be curved and the reflector could be planar.

A concave or a convex curve can be used. In addition, the curve can be irregular and/or nonsymetric.

A plurality of laser diodes, which could be implemented as an integrated diode array, is used to generate a plurality of radiant energy output beams which extend substantially in parallel with one another. The beams are directed so as to fall upon the grating with "grazing incidence". This requires that the grating be oriented at an acute angle with respect to the orientation of the incoming radiant energy beams.

The grating deflects the beams in a known fashion onto the reflective member. The reflective member, due to one of the reflective member or the grating being curved, destroys the shift invariance of the system and causes the lasing wavelengths of the individual diodes to vary.

A transmitter in accordance with the present invention can produce a plurality of parallel, spaced apart, output beams wherein each beam has a different wavelength. The structure of the transmitter is such that each incoming beam makes two passes off of the grating. As a result, this increases the wavelength selecting capability of the grating which in turn precisely sets the lasing wavelength of the members of the array. Thus, each output radiant energy beam exhibits a very high degree of spectral resolution of the nominal center wavelength.

A second output from a transmitter in accordance with the present invention is a combined beam formed of each of the selected wavelengths for the transmitter. This combined or composite beam is focused at a predetermined location adjacent to the transmitter.

A fiber optic communication transmission medium can be coupled to the transmitter at the focal point for the composite beam if desired. Alternately, each of the single wavelength output beams can be focused to either a fiber optic transmission medium or to another apparatus for further processing.

In another disclosed embodiment of the invention, the output parallel beams can each be passed through a separate optical amplifier. Utilizing separate optical amplifiers minimizes any intermodulation or cross-talk effects and produces higher output power levels in the output beams.

To improve characteristics of the incoming beams from the diode array, a collimating lens array can be positioned between the diodes and the dispersive element. In a disclosed embodiment, the incoming beams can be collimated to 1.8 mm in diameter prior to being directed onto the dispersive element.

The dispersive element can be formed of a holographic grating having line densities on the order of 1500–2400 lines per mm. Alternately, high resolution prisms are also usable as dispersive elements.

A transmitter which embodies this invention is useful in optical communications systems, optical data storage systems and spectroscopic systems. This invention will also be useful in communications systems and computer networking, polychromatic data storage and optical spectroscopy.

With a multiple wavelength source, in accordance with the present invention, independent modulation of different wavelength components can be used to provide very high bandwidth communications. The present source can be used for wavelength sensitive recording in spectral hole burning and volume holographic media. These applications result in high density data storage. Controlled multiple wavelength generation in accordance with the present invention can be used in multiple line spectroscopic sensors for environmental monitoring and reaction analysis.

DETAILED DESCRIPTION OF THE PREFERRED EMBODIMENT

While this invention is susceptible of embodiment in many different forms, there is shown in the drawing, and will be described herein in detail, specific embodiments thereof with the understanding that the present disclosure is to be considered as an exemplification of the principles of the invention and is not intended to limit the invention to the specific embodiments illustrated.

Figures 1, 2:
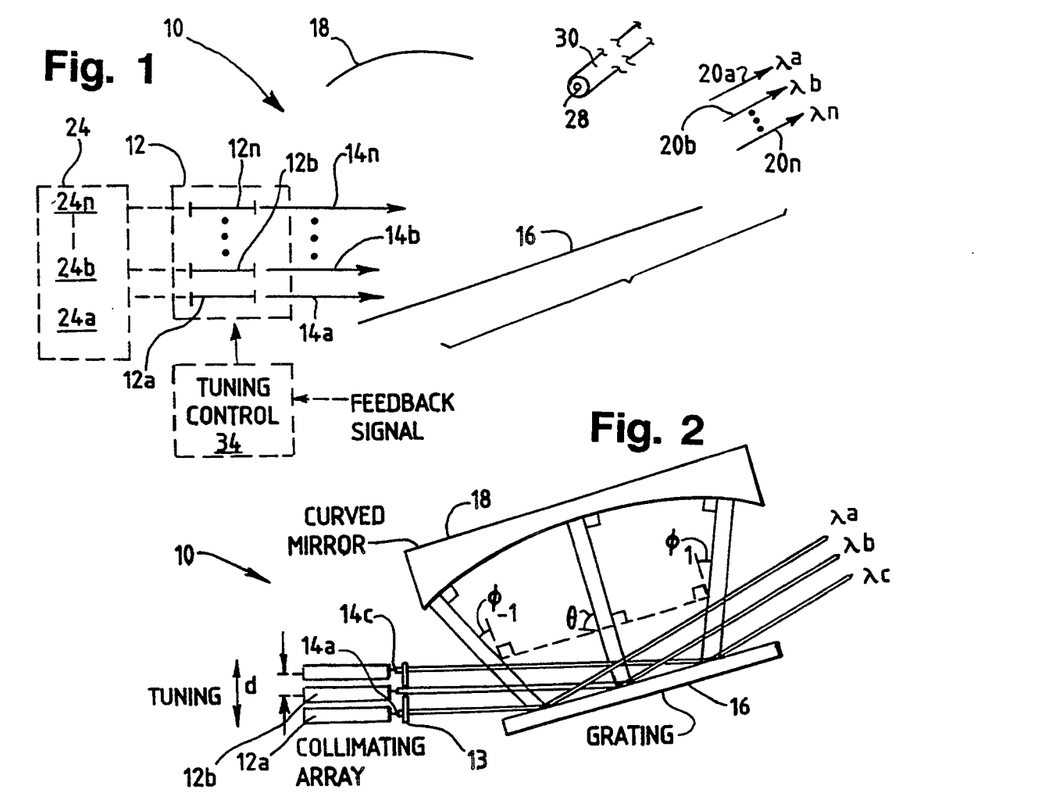
FIG. 1 is a block diagram of a source in accordance with the present invention.
FIG. 2 is a schematic representation of the source of FIG. 1.

FIG. 1 illustrates in block diagram form a transmitter 10 for producing substantially single mode radiant energy beams each having essentially a single wavelength. The wavelengths can be spaced a predetermined distance apart. The output beams can be used for environmental monitoring or for communications purposes.

The transmitter 10 includes an array 12. The array 12 can be formed of laser diodes of 12a-12n. The diodes can be caused to lase at predetermined wavelengths.

The array 12 may include an integrated or discrete collimated lense array.

The elements 12a-12n can be discrete elements spaced a selected distance apart, such as 3 mm. For example, Sharp LTO 24 MDO laser diodes can be mounted coextensively on a common substrate to form the array 12. Other commercially available laser diodes could also be used.

Alternately, the array 12 can be formed as a single integrated unit. Integrated diode arrays are known. It will be understood that neither the detailed construction of the array 12 nor the types of laser diodes represent limitations of the present invention.

The transmitter 10 also includes a dispersive element 16, which could be a diffraction grating, and a reflective element 18. At least one of the dispersive element or the reflector should be curved as discussed subsequently. Whether the reflector 18 is curved, as in FIG. 1, or the dispersive element 16 is curved is not a limitation of the present invention.

The array 12, having laser elements 12a, 12b-12n produces a plurality of parallel output beams 14a-14n which may have the same or different wavelengths as discussed subsequently. The beams 14a-14n are directed so as to be incident on the deflector 16.

The dispersive element 16 is oriented at an acute angle with respect to the incoming beams 14a-14n. As a result, the beams are "grazingly incident" on the element 16. A highly collimated beam as a result illuminates a greater area of the element 16 than the cross-sectional area of the beam and this provides greater wavelength resolution.

The dispersive element 16 and the reflector 18 form an external cavity which causes sources 12a-12n to lase at predetermined wavelengths $\lambda a$-$\lambda n$. The lasing frequencies are established by the optical paths of the beams 14a-14n in combination with the elements 16 and 18. The lasing wavelengths $\lambda a$-$\lambda n$ may be different from an inherent lasing wavelength of any of the diodes 12a-12n.

The transmitter 10 generates two different outputs. One output is a plurality of substantially parallel, essentially single wavelength beams 20a-20n. The beams 20a-20n each have a wavelength $\lambda a$-$\lambda n$ corresponding to the wavelength at which the respective source 12a-12n is caused to lase by the interaction of the deflector 16, the reflector 18 and the physical characteristics of that source.

The output beams 20a-20n can be modulated, for example by one or more modulators such as modulators 24a-24n shown in phantom in FIG. 1, with information signals if desired. The information can be provided by one or more digital processors.

The beams 20a-20n can be amplified if desired and coupled to a transmission medium such as one or more fiber optic cables. Alternately, the beams 20a-20n can be transmitted through the atmosphere and sensed remotely to carry out environmental monitoring.

The transmitter 10 provides a second output at a focal point 28. Back reflected components of the beams 14a-14n converge on the point 28.

An input port for a transmission medium 30 such as a fiber optic cable, could be located at the point 28. The combined, modulated beams which embody wavelength division multiplexing could be transmitted on a single medium.

Further, for tuning purposes a control signal can be fed back from one of the outputs to displace the array 12. Alternately, the reflector 18 could be moved for tuning. An exemplary closed loop tuning system 34 is illustrated in phantom in FIG. 1.

The transmitter 10 is illustrated in more detail in FIG. 2. The laser diode array 12 is coupled to an external laser cavity containing a diffraction grating 16 and a curved mirror 18. Radiant energy beams 14a-14n from the diode array 12 are collimated by a lenslet array 13 and are diffracted onto the curved mirror 18 by the diffraction grating 16.

The mirror 18 provides feedback into the diode array 12. This causes each diode in the array to lase in a specific cavity mode. The curvature of the mirror 18 destroys the shift invariance of the transmitter 10 and causes the center frequencies of the lasing wavelengths of the individual diodes 12a–12n to vary. Each diode can be spaced a predetermined distance "d" from each adjacent diode in the array or a distribution of distances between diodes can be used to vary the generated wavelengths.

The diodes 12a–12n in the array 12 have a high reflectivity coating on the back facet and an antireflection coating on the front facet for external cavity operation. The output radiant energy beams 14a–14n of the array 12 are collimated and diffracted off the grating 16 and off a different part of the curved feedback mirror 18.

The combination of the grating 16 and the curved surface of the mirror 18 imposes a different resonance condition on each diode in the array 12. The result is that each diode lases at different wavelength. The individual wavelengths are not coherent with respect to one another.

The output of the cavity may be the zeroth diffraction order of the grating 16 as illustrated in the FIG. 2. Since different diffraction orders will result in different focusing characteristics, the output may be a higher diffraction order.

Figure 3:
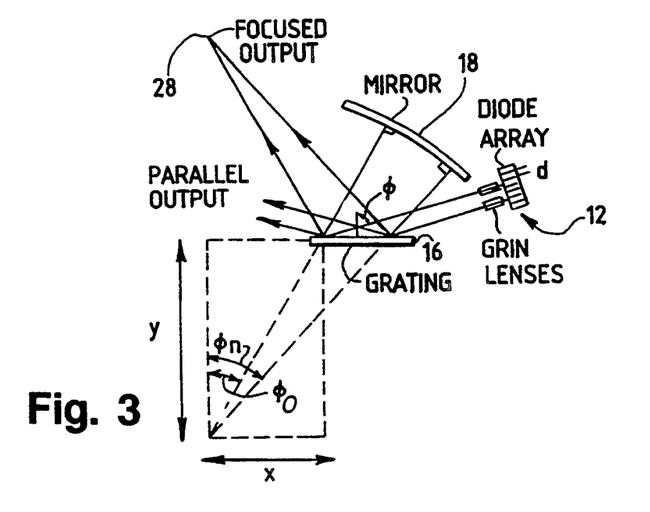
FIG. 3 is a diagram illustrating optical characteristics of the source of FIG. 1.

The lasing wavelength for each channel can be determined by applying ray tracing and the grating equation as illustrated in FIG. 3. The angle the first channel makes with respect to the grating, $\Phi_o$, is $\tan^{-1}[x/y]$ where x and y are defined in FIG. 3. X and y are referenced from the center of the radius of curvature of the mirror 18. The lasing wavelength $\lambda_o$, is determined by the grating equation $\lambda_o = \Lambda(\sin\Theta + \sin\Phi_o)$ where $\Lambda$ is grating period and $\Theta$ is the angle the incident parallel beam make with respect to the grating normal. Each subsequent channel is displaced in the direction along the grating by a distance $(d\ n)/\cos(\Theta)$ where d is the distance between the diodes. The wavelength of the $n^{th}$ channel may therefore be written as $$\lambda_n = \Lambda[\sin(\theta) + \sin(\phi_n)] \quad (1a)$$

where $$\phi_n = \tan^{-1}\left(\frac{x + (dn)/\cos(\theta)}{y}\right) \quad (1b)$$

These equations may be re-written to show the explicit dependence on r (The radius of curvature of the mirror 18.) using $r = (x^2+y^2)^{\frac{1}{2}}+q$ where q is the distance along the radius from the end of the grating 16 to the mirror 18. For a selected set as parameters, (see FIG. 4), the wavelength offset $\Delta\lambda_n = \lambda_n - \lambda_{n-1}$ between diodes 12a–12n is nearly constant and thus However, $\Delta\lambda_n$ does contain a small non-constant term that depends on position because of then on linear dependence of $\Phi$ on n. This non-constant dependency of $\Delta\lambda_n$ can be partially compensated for in optical communication systems using grating demultiplexers because the demultiplexer also has a $\sin\Phi$ dependence.

The transmitter 10 has two outputs. The parallel output in FIG. 2 is the zeroth order reflection of the forward propagating beam from the array 12.

The second output is the reflection off the grating 16 from the beam retroreflected from the curved mirror 18. Because these back propagating beams are normal to the mirror surface the individual beams focus at a distance T/2 and beams combine at a distance T away from the mirror as illustrated in FIG. 3.

The ratio of the parallel to the combined output power depends on the type of grating and angle of incidence of the beams. It is ~6.0 (parallel/combined) for a realized embodiment. It is expected that total output power for the parallel beams in a range of ½–1 milliwatts can be realized. For the combined output, a power level of ¼–½ milliwatts should be realizable.

Either the parallel or the combined output can be used for monitoring performance of the transmitter 10. Tuning control 34 can be used to adjust the tuning by moving only a single element. The combined output at the point 28 can be used to couple the multiple wavelengths into the fiber 30.

The lasing wavelength is determined by the term $x+(d\ n)/\cos(\Theta)$ in Eq. (1b). This position dependent wavelength implies that wavelength tuning may be accomplished by moving the diode array 12 (and collimating optics 13) with respect to the mirror 18 and the grating 16. As the diode array 12 moves, the resonance condition for each diode 12a–12n changes and thus the lasing wavelength of each diode changes. Tuning can be accomplished by moving the diode array 12 laterally in a plane transverse to the direction of propagation as illustrated in FIG. 2. The tuning slope (wavelength/distance) when the array 12 is moved laterally is $\sim \Delta\lambda/d$ where the wavelength offset assumed is constant.

The wavelength offset may be changed by moving the grating 16 with respect to the mirror 18. For example, the offset is changed by moving the grating 16 in the y-direction in FIG. 3. However, the change in the offset wavelength also changes the lasing characteristics.

Thus, for independent control of the offset and wavelength, the offset is adjusted first and then the array 12 is tuned. For separate diodes that can be moved relative to one another, the offset tuning can be accomplished by simply changing the relative lateral spacing between the diodes 12a–12n.

It is an important advantage that lateral motion for either tuning or offset control does not affect the location of the combined zeroth order since this point is strictly a function of the location of the mirror 18 which remains fixed. Thus in fiber coupled applications, where the combined zeroth order is used as an input to the medium 30, any operating parameter of the array 12 may be adjusted without re-aligning the coupling optics.

In summary, movement of the mirror 18 moves the focus point 28 but not the parallel outputs 20a–20n. Movement of the array 12 moves the outputs 20a–20n but not the focus point 28.

If the residual reflectivity of the front facet of a selected diode is sufficiently small, the tuning and offset control are continuous with respect to the intra-cavity Fabry-Perot modes of that laser diode and the laser will be single mode and exhibit very narrow linewidths. However, even if there are solitary modes present, the external cavity will select a solitary laser mode. These modes can also be tuned, but over a more limited range.

While mechanical and thermal instabilities affect the entire cavity and thus all of the lasing wavelengths, the change in the offset wavelength from any instability is a second order effect. As a result, the actual wavelength offset is a function of the geometry of a cavity.

Figure 4:
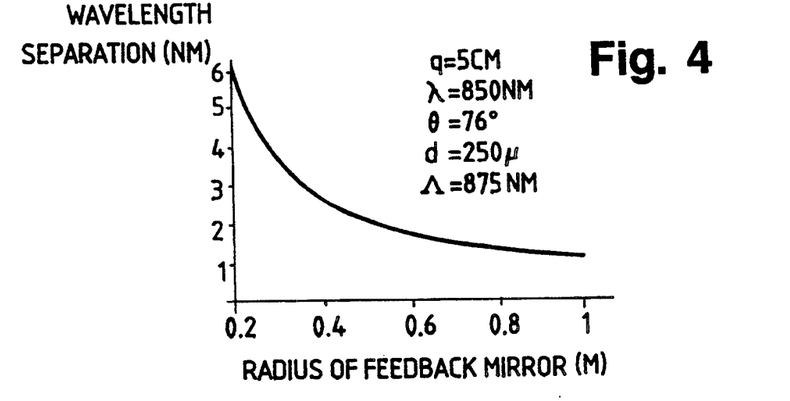
FIG. 4 is a graph of wavelength separation vs. reflector radius.

FIG. 4 illustrates wavelength offset for typical cavity parameters. The curve indicates that for the parameters chosen, changing the focal length of the mirror 18 from 10 cm to 25 cm changes the wavelength spacing 4 nm.

The ability to control the wavelength through the geometry is an important advantage that is useful in optical memory systems. The independence of the wavelengths implies that each diode, such as diode $12n$, forms its own external cavity.

As noted previously, the array 12 could be implemented using discrete laser diodes spaced 3 mm apart. Alternately, an integrated diode array could be used. As noted above, whether a plurality of discrete laser diodes or an integrated diode array is used is not a limitation of the present invention. For measurement purposes, a diode laser array was manufactured at Amoco Technology Company.

The single diodes are 4 $\mu$m wide single stripe index guided quantum well lasers on 250 $\mu$m centers with 500 $\mu$m long cavities. Index guiding was obtained via impurity induced layer disordering (si diffusion) in an open tube furnace. Without external feedback, each element was single mode.

Figure 5:
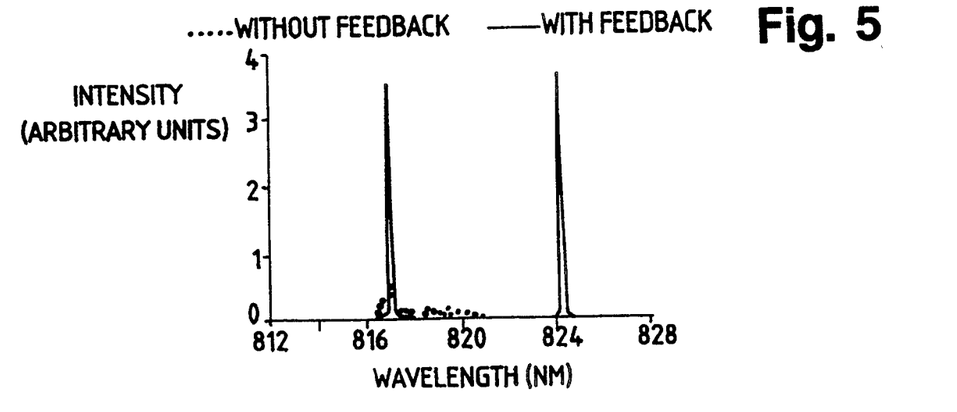
FIG. 5 is a graph of output spectra of two laser elements.

The back surface of each diode was HR coated ($\sim$98 percent). The front facet had an optimized AR coating ($<$0.2 percent over 50 nm) centered at 810 nm. Two diodes in the array 3.5 mm apart were individually collimated using 0.18 pitch 1.8 mm diameter single layer AR coated GRIN lenses. FIG. 5 shows typical spectra with and without external feedback. With the mirror 18 blocked and the current set to below threshold for each laser diode element, only the spontaneous omission is observed. With the same subthreshold current setting, but in the presence of the external cavity, both elements lased. The wavelengths were single mode and the wavelength spacing agreed with theory within the resolution of the instrument.

Spectral results are illustrated in FIG. 5. The plot shows outputs for two diodes spaced 3.5 mm apart. With the mirror blocked and the diode current set to below a threshold for each laser element, only the spontaneous emission is observed. With the same subthreshold current setting, but in the presence of the external cavity, both elements lased. The wavelengths were single mode and within 4% of the theoretical predicted wavelength spacing.

Figure 6:
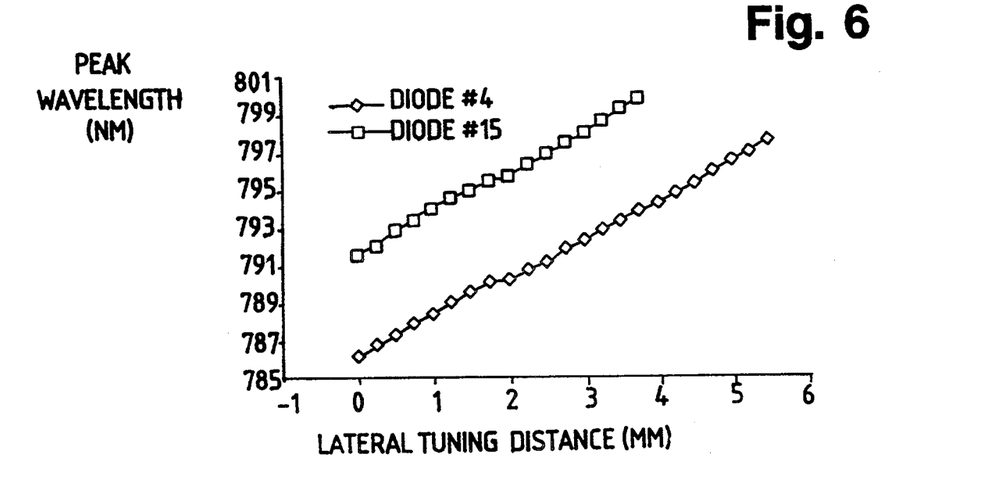
FIG. 6 is a graph of output wavelength for two laser elements as a function of diode array position.

FIG. 6 shows that when the external cavity is tuned by translating the diode array (see FIG. 1), the wavelength between the two diodes remains nearly constant. This fixed offset between the channels and the ability to tune all of the channels together makes this system extremely attractive for systems applications.

Figure 7:
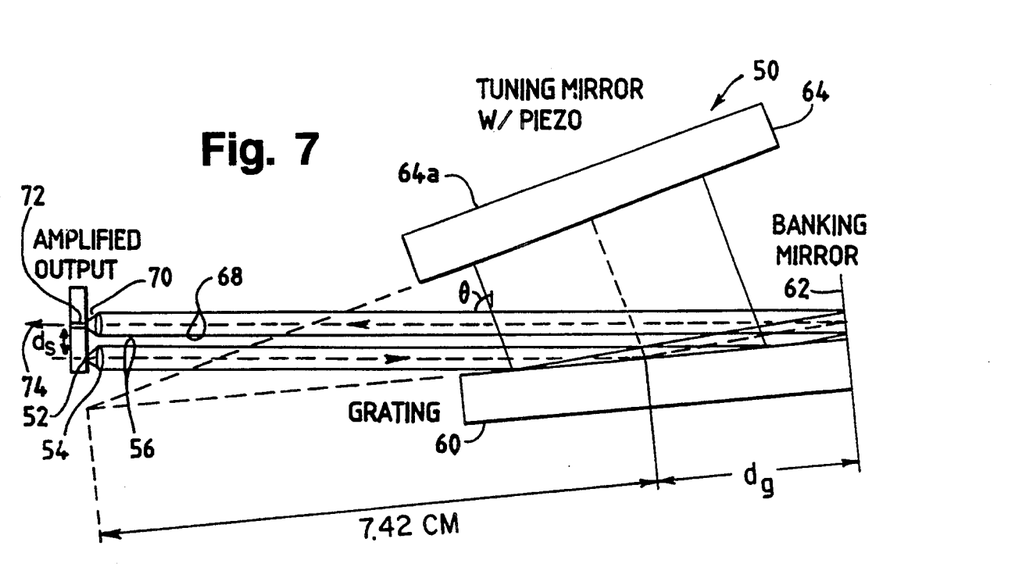
FIG. 7 is a single channel transmitter in accordance with the present invention with an amplified output.

FIG. 7 illustrates a single channel transmitter 50 which includes an amplified output. The transmitter 50 includes a modulatable laser diode or oscillator 52 with an output beam which passes through a collimating lens 54. The collimated beam, generally indicated at 56 is oriented to be incident, with an acute angle, on a dispersive element 60 which can be implemented as a diffraction grating.

A banking mirror 62 is affixed to an end of the grating 60 and is perpendicular thereto. A tuning mirror 64 is displaced relative to the grating 60.

The mirror 64 can be adjusted for precise tuning by means of a piezoelectric element 64a aimed thereon. Piezo turning can be combined with more extensive translations of either the diode 52 or the mirror 64.

Radiant energy in the collimated beam 56 is dispersed by the grating, at least in part, so as to be normal and incident on the tuning mirror 64. Back reflected radiant energy is again dispersed by the grating in part back to the laser diode 52 thereby causing it to lase at a wavelength set by the geometry of the transmitter 50.

The zeroth order reflection of the radiant energy is reflected off of the banking mirror 62. This forms a collimated beam generally indicated at 68 which is incident upon a focusing lens 70.

Output from the focusing lens 70 is an input to an optical amplifier 72. Output from the optical amplifier 72 is an amplified radiant energy beam 74 which has a wavelength corresponding to the wavelength at which the laser diode 52 lases in response to the back reflected radiant component.

As is illustrated in FIG. 7, the amplified output is adjacent to but displaced from the originating laser diode 52 by a distance $d_S$. The distance $d_S$ is relatively small because the grating 60 is oriented at an acute angle relative to the incident beams 56. As a result, the diode 52 could be fabricated on the same substrate as the amplifying element 72 thereby minimizing temperature or other environmental variations.

The following design equations pertain to the transmitter of FIG. 7:

$$d_S = d_g \frac{\sin(\pi - 2\theta)}{\sin(\theta)}$$

Figure 8:
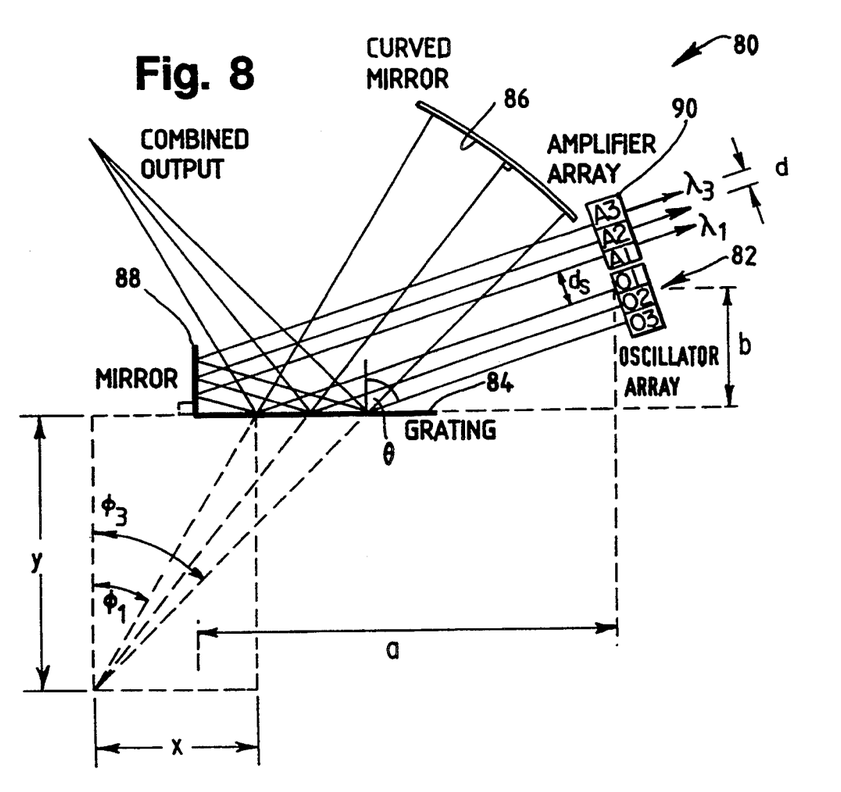
FIG. 8 is a diagram of a multiple-channel transmitter wherein each channel is independently amplified.

FIG. 8 illustrates a multi-channel transmitter 80 wherein each of the channels is independently amplified. Since each of the channels is amplified independently cross-talk or intermodulation effects between channels can be substantially eliminated. This is a very important advantage of the transmitter 80.

The following design equations pertain to the multi-channel transmitter of FIG. 8:

$$\lambda_i = \Lambda(\sin\theta + \sin\theta_i)$$

$$\theta_i = \tan^{-1}\left[\frac{x + d(i-1)/\cos\theta}{y}\right]$$

$$d_S = 2(a\cos\theta - b\sin\theta)$$

The transmitter 80 includes an oscillator or laser diode array indicated at 82. Output from the array 82, a plurality of spaced apart radiant energy beams, is directed to a dispersive element 84 which could be a defraction grating.

Displaced from the grating 84 is a curved reflector 86. The radiant energy beams from the array 82 are deflected onto the curved mirror 86 as discussed previously with respect to FIGS. 1 and 2. Back reflected radiant energy from the mirror 86 in turn is deflected by the grating 84 into the respective elements of the array 82 thereby causing same to lase at a plurality of different wavelengths. The zeroth order reflection of the forward propogating beam from the array 82 is deflected off of the grating 84 onto a mirror 88. The mirror 88 is oriented so as to be perpendicular to the grating 84.

Parallel radiant energy beams incident on the mirror 88 are in turn reflected therefrom, as a plurality of spaced apart parallel beams onto an optical amplifier array 90. Each of the beams is amplified in a respective member of the array 90 thereby producing a set of amplified output radiant energy beams. Each of the amplified beams has a wavelength set by the respective lasing member of the oscillator array 82.

Another advantage of the transmitter 80 is that the oscillator or laser diode array 82 is located adjacent to the amplifier array 90 and both arrays could be fabricated on a common substrate. In addition to providing common compensation for both arrays, this arrangement also provides for common tuning as noted previously with respect to transmitter 10 of FIG. 1.

Figure 9:
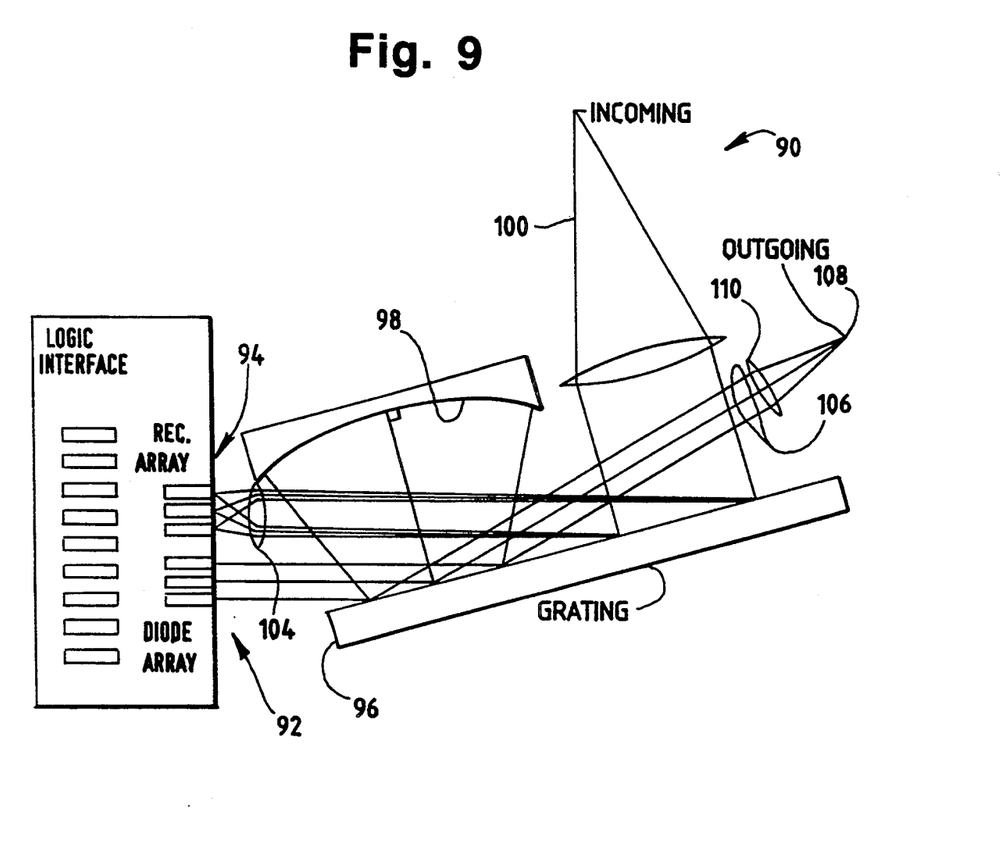
FIG. 9 is a diagram of a tranceiver in accordance with the present invention.

FIG. 9 illustrates an external cavity transceiver 90. The transceiver 90 has a transmission diode array 92 and a photosenstive receiving array 94.

A dispersive element 96 in combination with a concave reflector 98 form an external cavity which will cause the elements of the diode array 92 to lase as discussed previously.

A common incoming optical signal 100 (perhaps from a fiber optic cable) passes through a lens 102 and is incident on the member 96. A second lens 104 directs the various incoming components to the elements of the receiving array 94.

The parallel outputs 106 can be focused to an input port 108 of a filter optic transmission medium by a lens 110.

From the foregoing, it will be observed that numerous variations and modifications may be effected without departing from the spirit and scope of the novel concept of the invention. It is to be understood that no limitation with respect to the specific apparatus illustrated herein is intended or should be inferred. It is, of course, intended to cover the appended claims all such modifications as fall within the scope of the claims.

We claim:

1. A multiple wavelength generator capable of providing coherent light beams wherein some of the beams have different wavelength comprising:
    a plurality of light sources wherein members of said plurality are arranged to generate a plurality of substantially parallel light beams;
    a grating disposed with said plurality of light beams incident thereon; and
    a reflective surface displaced from said grating wherein one of said grating and said surface is planer and the other is curved and wherein said surface and said grating are oriented to reflect a portion of each said beam back into a said respective source thereby causing each said source to lase at a different wavelength than at least some of said other sources of said plurality and capable of generating at least a plurality of spaced output beams corresponding to said lasing wavelengths.

2. A generator as in claim 1 wherein each said light source is a laser diode and each said source is displaced a predetermined distance from at least one other source.

3. A generator as in claim 1 wherein said grating is a diffraction grating and said reflective surface is concave.

4. A generator as in claim 1 including a collimating array disposed between said plurality of sources and said grating.

5. A generator as in claim 1 wherein said grating is oriented such that said plurality of output beams corresponds to a zero diffraction order of said grating.

6. A generator as in claim 1 wherein said grating and said reflective surface interact to produce a combined, output beam focused at a selected distance from said grating.

7. A generator as in claim 1 wherein one of said plurality of sources or said mirror is movable relative to said grating to produce an adjustable plurality of output wavelengths.

8. A generator as in claim 1 including an optical amplifier coupled to one of said spaced output beams.

9. A generator as in claim 1 wherein said members of said plurality are formed as an integrated array.

10. A multiple frequency optical source comprising:
    an array of laser diodes oriented to produce a plurality of parallel, spaced-apart, radiant energy beams;
    a grating disposed with said parallel radiant energy beams incident thereon, and oriented to selectively deflect said beams; and
    a mirror having a selectively curved surface, displaced from said grating, for receiving a portion of each of said deflected beams and for substantially deflecting said received portion back to said grating whereat a first part of each back-reflected beam is deflected to be incident on a respective one of said laser diodes causing each said diode to lase at a selective wavelength and whereat a second part is directed to a common focal point thereby forming a common, multiple wavelength beam.

11. A source as in claim 10 wherein said grating deflects a second portion of each of said beams forming a plurality of parallel outputs with each of said outputs having a wavelength corresponding to a wavelength of one of said source wavelength.

12. A source as in claim 10 including an output coupler at said common focal point for coupling said incident, second part to a common transmission medium.

13. A source as in claim 10 including at least one modulator coupled to one member of said array for modulating a respective one of said radiant energy beams.

14. A source as in claim 10 including a control element for tuning said source.

15. An optical communication system comprising:
    at least one modulator;
    a plurality of laser sources wherein at least said one modulator is coupled to one of said sources such that said modulated source generates a modulated radiant energy beam responsive to said modulator wherein said beams are spaced apart and substantially parallel;
    a diffraction grating disposed at an angle to said beams to deflect same; and
    a reflector surface spaced from said grating and disposed to receive and reflect a portion of said reflected beams back to each of said respective sources thereby causing same to lase and wherein another portion is deflected to a common point.

16. An optical communication system as in claim 15 including an output port whereat a plurality of spaced apart, parallel radiant energy beams is provided wherein each member of said plurality has a wavelength corresponding to a lasing wavelength of a respective one of said sources.

17. A method of producing a plurality of parallel, spaced apart, radiant energy beams comprising:
    providing a plurality of laser sources;
    providing a dispersive element;
    generating a plurality of parallel radiant energy beams using the sources;
    directing the beams onto the dispersive element so as to illuminate a larger area of the element than a cross-sectional area of each of the respective beams;

dispersing each incident beam into at least two components oriented in first and second directions wherein the first components correspond to an output and the second components are back reflected onto the dispersive element so as to destroy shift invariance wherein each back reflected component is dispersed in part so as to be incident on a respective one of the laser sources thereby causing the sources to lase at a corresponding plurality of wavelengths.

18. A method as in claim 17 including amplifying each of the outputs at a respective wavelength.

19. A method as in claim 17 including tuning the plurality of wavelengths.

20. A multiple wavelength source comprising:
a plurality of radiant energy generators wherein each said generator is capable of lasing at a respective wavelength thereby producing a radiant energy beam and wherein each said generator is oriented with a respective one of said beams extending essentially parallel to at least one other beam from another one of said generators;
a dispersive element disposed such that said parallel radiant energy beams from said generators are grazingly incident thereon and deflected thereby;
a shift invarience destroying element displaced relative to said dispersive element wherein said deflected beams are incident thereon and each said deflected beam is returned to said dispersive element, each of said returned beams is separated into one component that is incident on a respective one of said generators thereby causing that generator to lase at a wavelength set at least by said dispersive element and said shift invariance destroying element and a second, output, component.

21. A source as in claim 20 wherein said dispersive element includes a diffraction grating oriented at an acute angle relative to said radiant energy beams.

22. A source as in claim 21 wherein said grating has a line density in a range of 1500–2400 lines/mm.

23. A source as in claim 20 wherein said shift invariance destroying element includes a reflector.

24. A source as in claim 23 wherein said reflector includes a curved mirror.

25. A source as in claim 20 including a plurality of amplifiers wherein each member of said amplifier plurality amplifes only an ouput component associated with a respective one of said generators.

26. A source as in claim 20 which includes an optical receiver.

* * * * *